(12) United States Patent
Hur et al.

(10) Patent No.: US 9,831,837 B2
(45) Date of Patent: Nov. 28, 2017

(54) DYNAMIC POWER DIVIDER CIRCUITS AND METHODS

(71) Applicant: QUALCOMM Incorporated, San Diego, CA (US)

(72) Inventors: Joonhoi Hur, San Diego, CA (US); Paul Joseph Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 480 days.

(21) Appl. No.: 14/533,988

(22) Filed: Nov. 5, 2014

(65) Prior Publication Data

US 2016/0126921 A1  May 5, 2016

(51) Int. Cl.
| | |
|---|---|
| *H03F 3/60* | (2006.01) |
| *H03F 1/56* | (2006.01) |
| *H03F 3/24* | (2006.01) |
| *H01Q 1/50* | (2006.01) |
| *H03F 3/68* | (2006.01) |
| *H03F 1/02* | (2006.01) |

(Continued)

(52) U.S. Cl.
CPC ............... *H03F 1/56* (2013.01); *H01Q 1/50* (2013.01); *H03F 1/0288* (2013.01); *H03F 3/24* (2013.01); *H03F 3/68* (2013.01); *H03H 7/48* (2013.01); *H01P 5/16* (2013.01); *H03F 2200/225* (2013.01); *H03F 2200/255* (2013.01); *H03H 11/36* (2013.01)

(58) Field of Classification Search
CPC . H03F 1/56; H03F 1/0288; H03F 3/24; H03F 3/68; H03F 1/0222; H03F 2200/102; H03F 1/07; H03F 3/60; H03F 3/602; H03F 3/211; H03F 3/06; H01Q 1/50; H03H 7/48; H03G 3/20; H03G 3/3042
USPC ......................................... 330/136, 286, 295
See application file for complete search history.

(56) References Cited

U.S. PATENT DOCUMENTS 5,111,157 A * 5/1992 Komiak .................. H03F 3/604
330/286
5,162,756 A * 11/1992 Taniguchi ............... H03F 3/604
330/295

(Continued)

FOREIGN PATENT DOCUMENTS

| EP | 2568598 B1 | 2/2014 |
|---|---|---|
| KR | 20040098857 A | 11/2004 |

(Continued)

OTHER PUBLICATIONS

International Search Report and Written Opinion—PCT/US2015/058663—ISA/EPO—dated Feb. 19, 2016.

*Primary Examiner* — Khanh V Nguyen
(74) *Attorney, Agent, or Firm* — Haynes and Boone, LLP (57) ABSTRACT

The present disclosure includes dynamic power divider circuits and methods. In one embodiment, a dynamic power divider includes first and second quarter wave lines that receive an input signal and produce first and second signal on second terminals of the lines. Dynamic power division of the input signal uses a variable impedance circuit between the second terminal of the first quarter wave line and the second terminal of the second quarter wave line. The variable impedance may reduce impedance between two output paths as the input signal power increases or increase impedance between the output paths as the input signal power decreases.

20 Claims, 5 Drawing Sheets

(51) Int. Cl.
  *H03H 7/48*     (2006.01)
  *H01P 5/16*     (2006.01)
  *H03H 11/36*    (2006.01)

(56) References Cited

U.S. PATENT DOCUMENTS

| | | | |
|---|---|---|---|
| 5,955,926 A * | 9/1999 | Uda | H03F 3/604 |
| | | | 330/295 |
| 6,005,442 A * | 12/1999 | Maeda | H03F 3/604 |
| | | | 330/295 |
| 6,621,347 B2 * | 9/2003 | Morimoto | H03F 3/193 |
| | | | 330/286 |
| 6,768,381 B2 * | 7/2004 | Kuriyama | H03F 1/18 |
| | | | 330/295 |
| 6,806,768 B2 | 10/2004 | Klaren et al. | |
| 7,164,903 B1 | 1/2007 | Cliff et al. | |
| 7,586,374 B2 * | 9/2009 | Bouny | H03F 1/0288 |
| | | | 330/136 |
| 7,961,048 B2 | 6/2011 | Oakley et al. | |
| 8,115,554 B2 * | 2/2012 | Ng | H03F 1/086 |
| | | | 330/124 R |
| 8,344,824 B2 | 1/2013 | Kim et al. | |
| 2009/0295473 A1 | 12/2009 | Dupuy et al. | |
| 2010/0002620 A1 | 1/2010 | Proctor, Jr. et al. | |
| 2013/0127564 A1 | 5/2013 | Ding et al. | |
| 2013/0241640 A1 | 9/2013 | Lin et al. | |
| 2014/0070883 A1 | 3/2014 | Gurvich et al. | |
| 2014/0132364 A1 | 5/2014 | Ehyaie | |

FOREIGN PATENT DOCUMENTS

| | | |
|---|---|---|
| KR | 20100004440 A | 1/2010 |
| WO | 2006006119 A1 | 1/2006 |

\* cited by examiner

| |
|---|
| receiving an input signal on a first terminal of a first quarter wave line to produce a second signal on a second terminal of the first quarter wave line having a first portion of the power of the input signal<br>801 |

↓

| |
|---|
| receiving the input signal on a first terminal of a second quarter wave line to produce a third signal on a second terminal of the second quarter wave line having a second portion of the power of the input signal<br>802 |

↓

| |
|---|
| adjusting an impedance of a variable impedance circuit coupled between the second terminal of the first quarter wave line and the second terminal of the second quarter wave line in response to a first signal representing a power characteristic of the input signal<br>803 |

↓

| |
|---|
| decreasing the impedance of the variable impedance circuit when a power of the input signal increases to increase the power of the second signal at the second terminal of the second quarter wave line<br>804 |

↓

| |
|---|
| increasing the impedance of the variable impedance circuit when the power of the input signal decreases to decrease the power of the second signal at the second terminal of the second quarter wave line<br>805 |

DYNAMIC POWER DIVIDER CIRCUITS AND METHODS

BACKGROUND

The present disclosure relates to electronic circuits and methods, and in particular, to dynamic power divider circuits and methods.

Power consumption in electronic circuits is a subject that is gaining increased attention. As the use of electronic devices becomes ubiquitous, the power consumed by these devices escalates, placing increasing demands on infrastructure and the environment. For example, wireless devices are contemporary culprits in the growing demand and consumption of energy and power. Circuitry inside RF transceivers often consumes large amounts of power to transmit, receive, and process RF communication signals.

One example circuit component that often inefficient and power hungry is the power amplifier. In a wireless application, a power amplifier receives a wireless communication signal and increases the power of the signal for transmission on an antenna. Processing the signal for transmission on the antenna may include dividing the signal along multiple signal paths, amplifying the signal to increase the voltage and/or current, and combining signals for transmission on an antenna. In cases where a signal is coupled along multiple paths, signal power is also typically divided among the paths. Over changing operating conditions, it is sometimes the case that particular paths may be less active or altogether inactive during some operating conditions and the signal power provided to such paths is wasted.

SUMMARY

The present disclosure includes dynamic power divider circuits and methods. In one embodiment, a dynamic power divider includes first and second quarter wave lines that receive an input signal and produce first and second signal on second terminals of the lines. Dynamic power division of the input signal uses a variable impedance circuit between the second terminal of the first quarter wave line and the second terminal of the second quarter wave line. The variable impedance may reduce impedance between two output paths as the input signal power increases or increase impedance between the output paths as the input signal power decreases.

The following detailed description and accompanying drawings provide a better understanding of the nature and advantages of the present disclosure.

DETAILED DESCRIPTION

The present disclosure pertains to dynamic power divider circuits and methods. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
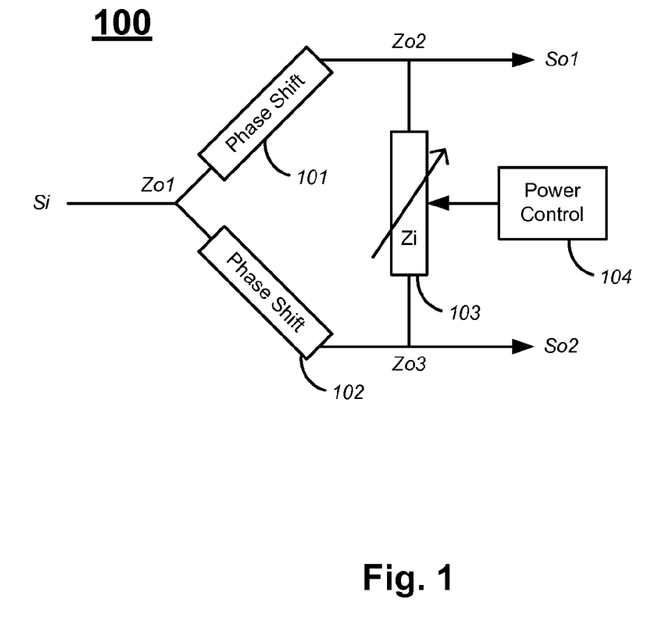
FIG. 1 illustrates a dynamic power divider according to one embodiment.

FIG. 1 illustrates a dynamic power divider according to one embodiment. Embodiments of the present disclosure include a power divider circuit that can dynamically route signal power between multiple signal paths. For example, power divider circuit 100 receives an input signal, Si, on a first terminal of a first quarter wave line 101 and on a first terminal of a second quarter wave line 102. In this example, quarter wave lines 101 and 102 produce a 90 degree phase shift ($\pi/4$) in the signal, Si. A quarter wave line is sometimes referred to as a quarter wave impedance transformer or a $\lambda/4$ impedance transformer, and may comprise a pre-determined length of a transmission line (a conductor) where the termination is designed to produce a desired impedance. As illustrated in a particular example below, impedance transformation may be used to improve the efficiency of a power divider.

Features and advantages of the present disclosure include coupling power divider output signal paths together through a variable impedance circuit 103. For example, in some applications it may be desirable to increase the signal power to path So1 and decrease the signal power to path So2 under certain conditions, and it may be desirable to decrease the signal power to path So1 and increase the signal power to path So2 under other conditions. Accordingly, variable impedance circuit 103 includes a control input to adjust the impedance, Zi, of the variable impedance circuit. A power control circuit 104 may provide one or more signals to the control input of the variable impedance circuit 103 to increase or decrease the impedance between path So1 and path So2, for example.

In one embodiment, the impedance, Zi, of the variable impedance circuit 103 is adjusted based on power conditions of the input signal. As the impedance, Zi, of the variable impedance circuit 103 is changed, the amount of signal power flowing between different paths may change based on the input signal power. For example, the impedance, Zi, of the variable impedance circuit 103 may be decreased when a power of the input signal, Si, increases to increase the signal power at the second terminal of quarter wave line 102 (path So2) and decrease the signal power at the second terminal of quarter wave line 101 (path So1). Similarly, the impedance, Zi, of the variable impedance circuit 103 may be increased when the power of the input signal, Si, decreases to decrease the signal power at the second terminal of quarter wave line 102 and increase the signal power at the second terminal of quarter wave line 101. Accordingly, signal power may be divided and transferred between path So1 to path So2 by adjusting Zi. In some applications, power division between paths may be asymmetric, wherein one path (e.g., path So1) may receive more signal power than another path (e.g., path So2) when Zi is high. Accordingly, in some embodiments, signal power from a high power path may be variably coupled to a lower power path based on input signal conditions by reducing Zi, for example. In various embodiments, variable impedance circuit 103 may comprise a switched resistor network, one or more semiconductor devices (e.g., a transistor or PIN diode), or combinations thereof. Further, power control circuit 104 may adjust the impedance based on envelope tracking, average power tracking, or a power control signal (e.g., from a modem), for example. Further examples of particular embodiments are provided below.

Figure 2:
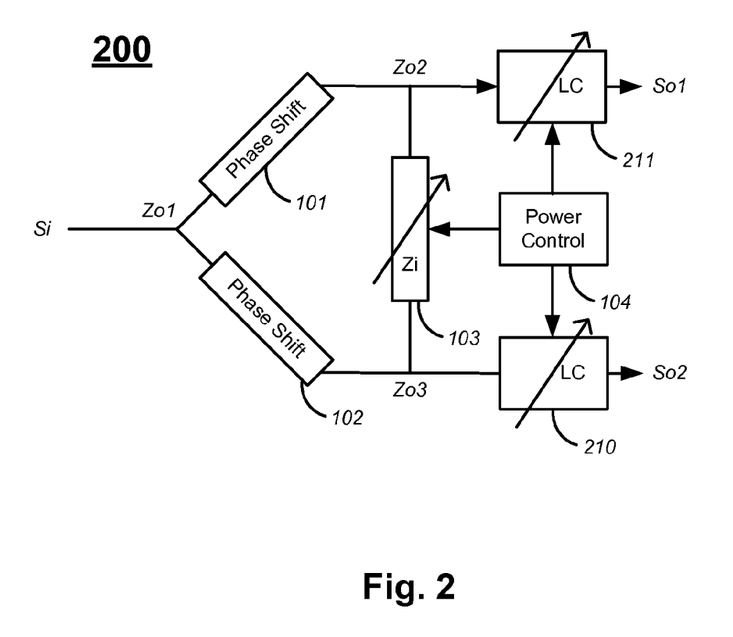
FIG. 2 illustrates a dynamic power divider according to another embodiment.

FIG. 2 illustrates a dynamic power divider according to another embodiment. As mentioned above, impedance transformation may be used to improve the efficiency of a power divider circuit. In this example, the impedance Zo3 at the second terminal of quarter wave line 102 is selectively adjusted to change the input impedance seen by input signal, Si, looking into quarter wave line 102. In this example, power divider circuit 200 includes an adjustable LC circuit 210, which may include inductors and capacitors to set the impedance Zo3. Capacitance, for example, in the adjustable LC circuit 210 may be programmable (e.g., using switched capacitors) to modify the input impedance of adjustable LC circuit 210 and change Zo3. In a first configuration, adjustable LC circuit 210 may produce a first impedance (at Zo3) at the second terminal of quarter wave line 102. The first impedance set by the particular LC configuration is translated through quarter wave line 102 to produce a corresponding second impedance (at Zo1) at the first terminal of quarter wave line 102. In the first configuration, the first impedance at Zo3 is less than the second impedance at Zo1. In a second configuration, adjustable LC circuit 210 may produce a third impedance (at Zo3) at the second terminal of quarter wave line 102, which is translated to a corresponding fourth impedance (at Zo1) at the first terminal of quarter wave line 102. In this configuration, the third impedance at Zo3 is greater than the fourth impedance at Zo1.

Based on the above operation of the adjustable LC circuit 210, some applications may dynamically reconfigure adjustable LC circuit 210 to produce different signal power division between multiple paths. For example, the adjustable LC circuit 210 may be configured to produce the first impedance (e.g., a low impedance at Zo3) when the power of the input signal decreases. The first low impedance at Zo3 is translated to the second high impedance at Zo1, which causes more signal power to travel through quarter wave line 101 to path So1 and reduces signal power through quarter wave line 102 to path So2. Accordingly, the power of the input signal, Si, transferred from the first terminal of quarter wave line 102 to the second terminal of quarter wave line 102 is decreased.

Similarly, the adjustable LC circuit 210 may be configured to produce the third impedance (e.g., a high impedance at Zo3) when the power of the input signal increases. In this case, it may be advantageous to route more signal power to the second path So2, for example. The third high impedance at Zo3 is translated to a fourth low impedance at Zo1, which causes more signal power to travel through quarter wave line 102 to path So2 and less signal power to travel through quarter wave line 101 to path S01, for example. Accordingly, the power of the input signal, Si, transferred from the first terminal of quarter wave line 102 to the second terminal of quarter wave line 102 is increased.

Operating together, the adjustable LC circuit 210 and the variable impedance circuit 103 may be used to control the amount of signal power delivered to path So1 and path So2. Since signal power is transferred in a controlled manner (e.g., by adjusting the impedance of Zi and the input impedance of line 102), the usage of power is advantageously more efficient.

In an alternative embodiment, circuit 200 may include a second adjustable LC circuit 211, which may change the impedance at Zo2 and Zo1 as described above to further control the division of power between the two paths.

Figure 3:
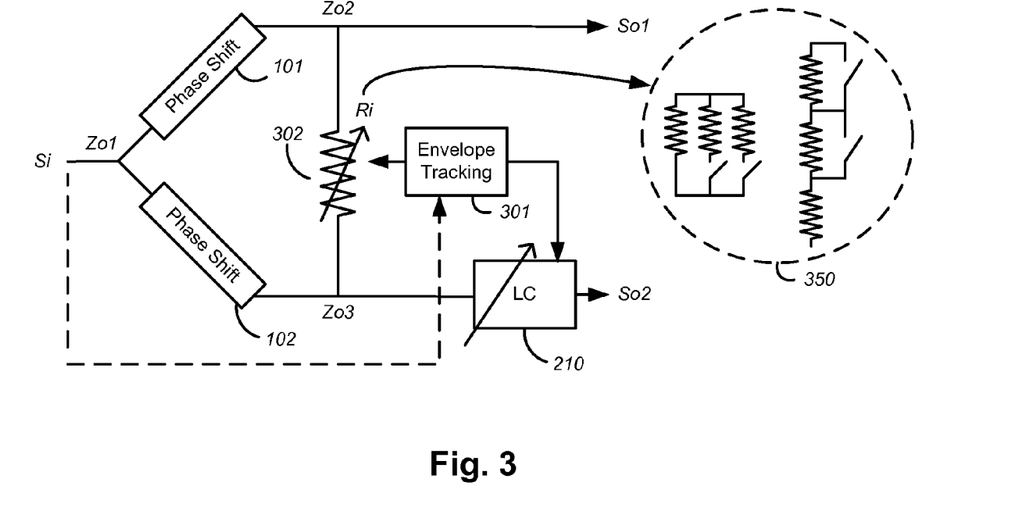
FIG. 3 illustrates an example power divider including an adjustable resistance according to another embodiment.

FIG. 3 illustrates an example power divider including an adjustable resistance according to another embodiment. This example shows a variable impedance circuit implemented using an adjustable (variable) resistance Ri 302, such as a switched resistor network, for example. Call out 350 shows two example implementations of switched resistors, for example. This particular example also shows that the power control circuit may be an envelope tracking circuit 301. Envelope tracking power control circuit 301 may receive an upstream envelope signal that corresponds to the envelope of input signal Si. As the envelope of Si increases, it may be advantageous to increase the signal power to the So2 path. For example, one power amplifier architecture illustrated below may include a main stage and a peaking stage. When the signal power is low, it may be advantageous to channel more signal power to the main stage, and when the signal power increases, it may be advantageous to increase power to the peaking stage, for example. Envelope tracking power control circuit 301 may receive an envelope signal and increase the value of Ri if the envelope is low. Accordingly, at low signal power levels, more signal power is channeled to the So1 path and less signal power is channeled to the So2 path. Alternatively, envelope tracking power control circuit 301 may receive an envelope signal and decrease the value of Ri if the envelope is high. Thus, at high signal power levels, more signal power is channeled from the So1 path through Ri to the So2 path. Accordingly, Ri may be changed at the envelope rate to efficiently move signal power between paths. Referring again to call out 350, in some example implementations one resistor may be fixed in series between the paths to set a maximum or minimum resistance between the paths. Optionally, as described above, at low signal power levels LC circuit 210 may be configured to produce a low impedance at Zo3, which is translated to a high impedance for input signal Si, and thereby channel input signal power to line 101 and path So1. Alternatively, at high signal power levels LC circuit 210 may be configured to produce a higher impedance at Zo3, which is translated to a lower impedance for input signal Si, and thereby channel input signal power to line 102 and path So2.

Figure 4:
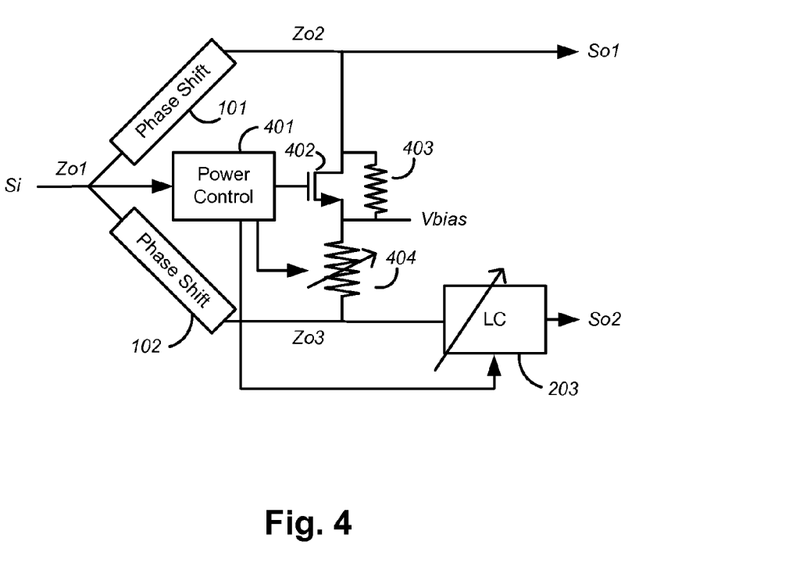
FIG. 4 illustrates an example power divider including a semiconductor device according to another embodiment.

FIG. 4 illustrates an example power divider including a semiconductor device according to another embodiment. This example illustrates one type of semiconductor device that may be used to vary the impedance between paths So1 and So2. In this example, a transistor 402 is coupled between a second terminal of quarter wave line 101 and a second terminal of quarter wave line 102. While an NMOS transistor is shown here, it is to be understood that other transistor types may be used. In this example, resistor 403 is coupled between the drain and source of transistor 402, and an adjustable resistance 404 is also optionally coupled between the source of transistor 402 and path So2 at the second terminal of quarter wave line 102. Finally, an adjustable LC 203 may be coupled to the second terminal of quarter wave line 102.

In one embodiment, power control circuit 401 may include an envelope detector. In this example, power control circuit 401 may receive the input signal Si and change the voltage at the gate of transistor 402 based on the signal envelope to increase or decrease the impedance between the second terminal of line 101 and the second terminal of line 102. In one embodiment, power control circuit 401 may include an average power generator to determine an average signal power and adjust the resistance 404. For example, power control circuit 401 may comprise a root-mean-square (RMS) filter to determine average signal power. Accordingly, in an example embodiment combining transistor 402 and adjustable resistance 404, the impedance of transistor 402 may change at the signal envelope rate and the impedance of the adjustable resistance 404 may change at a slower average power rate, for example. In some cases, adjustable resistance 404 may be set during manufacturing (e.g., in the factory) and remain fixed during operation to set a minimum resistance between the second terminals of lines 101 and 102. Accordingly, in that case transistor 402 sets the range of variation of impedance between the paths.

Figure 5:
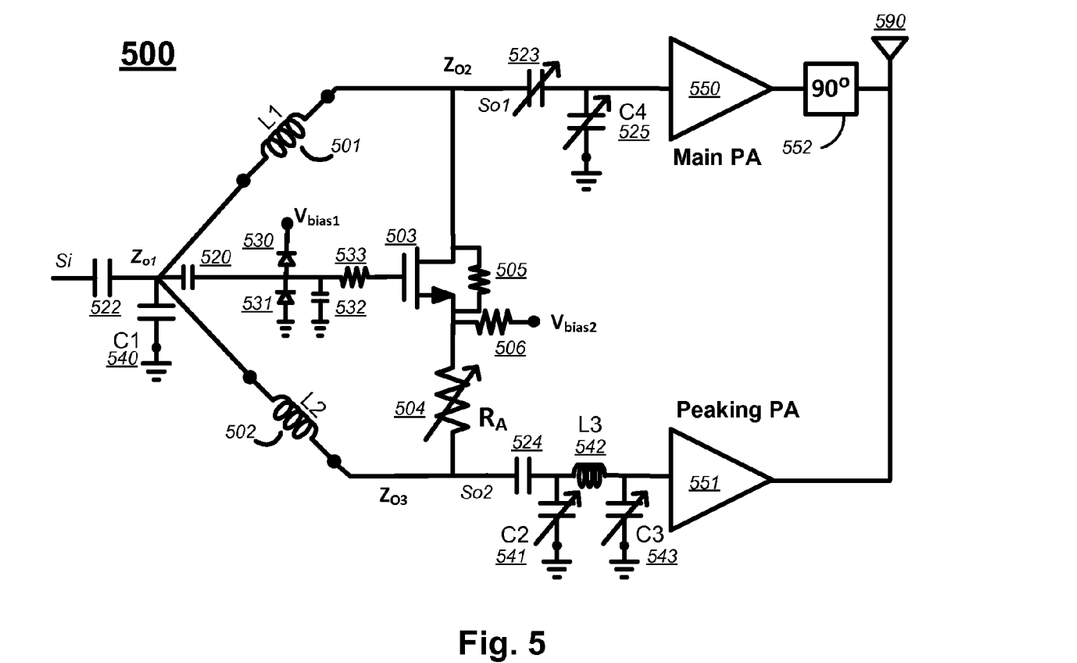
FIG. 5 illustrates an example power divider at the input of a power amplifier according to one embodiment.

FIG. 5 illustrates an example power divider at the input of a power amplifier according to one embodiment. In this example, dynamic power divider includes a first quarter wave line inductor 501, second quarter wave line inductor 502, envelope tracking power control circuit (components 530-533), adjustable impedance circuit (components 503-506), and an adjustable LC circuit (components 541-543). The dynamic power divider is configured to produce two signals, So1 and So2, for a main power amplifier stage 550 and a peaking power amplifier stage 551. Due to different bias conditions between the main and peaking stages, the impedance Zo2 may be different than the impedance Zo3 (e.g., Zo2>Zo3>Zo1), which results in a naturally asymmetric distribution of signal power between the two paths. The output of main stage 550 is coupled through another quarter wave circuit 552 to the output of peaking stage 551 and to antenna 590 for driving RF communication signals to the airwaves. In this example, main stage 550 and peaking stage 551 are configured as a Doherty power amplifier stage.

In this example, input signal Si is coupled to an envelope tracking power control circuit comprising diodes 530 and 531, capacitor 532, and resistor 533 that operate as an envelope detector. Si is coupled to a node between series connected diodes 530 and 531 arranged between a bias voltage, Vbias1, and ground. The diodes rectify the input signal, and capacitor 532, resistor 533, and parasitic gate capacitance of transistor 503 low pass filter the rectified signal to produce an envelope. The envelope is used as a control input to the gate of transistor 503 to adjust the impedance between Zo2 and Zo1 as set forth above. In this example configuration, the resistance between the main PA path and peaking PA path may be as follows:

$$V_{GS} = F(P_{IN})$$

$$R_{IsolateAC} = RA + RON = RA + \frac{1}{\frac{u_n C_{ox} W}{L}(VGS - VTH)}$$

Where Pin is the envelope signal corresponding to the input power of the input signal provided to the gate of transistor 503, RA is the resistance 504, and RON is the ON resistance of transistor 503, which is a function of the gate to source voltage VGS, threshold voltage VTH, and physical parameters of the transistor.

Resistor 506 is coupled to another bias voltage, Vbias2, to set the bias point on transistor 503. Capacitor 520 provides AC coupling to the envelope tracking components and variable impedance set by transistor 503. In this example, variable resistor 504 may be set at a fixed value to set the minimum resistance between paths, where the range of transistor 503 sets the range of impedance between the paths.

In this example, power division of input signal Si is achieved using two quarter wave lines comprising inductors L1 and L2. Si is coupled to first terminals of each inductor through AC coupling capacitor 522. A first quarter wave transformation is achieved by a combination of capacitor C1, inductor L1, and capacitor C4 525. Similarly, a second quarter wave transformation is achieved by a combination of capacitor C1, inductor L2, and capacitor C2 521. Signals So1 and So2 are coupled through AC coupling capacitors 523 and 524 to the main and peaking stages, respectively. So2 is coupled through an adjustable LC circuit comprising programmable capacitances C2 541 and C3 543 and inductor L3 542. The impedance at Zo3 may be adjusted by reconfiguring C2 and/or C3 for example. L3, C2, and C3 may also provide a quarter wave shift at the input of the peaking amplifier 551. In one embodiment, capacitors 523 and 525 may be adjustable (e.g., programmable) to change the impedance at Zo2 and modify the division of power between So1 and So2, for example.

Figure 6:
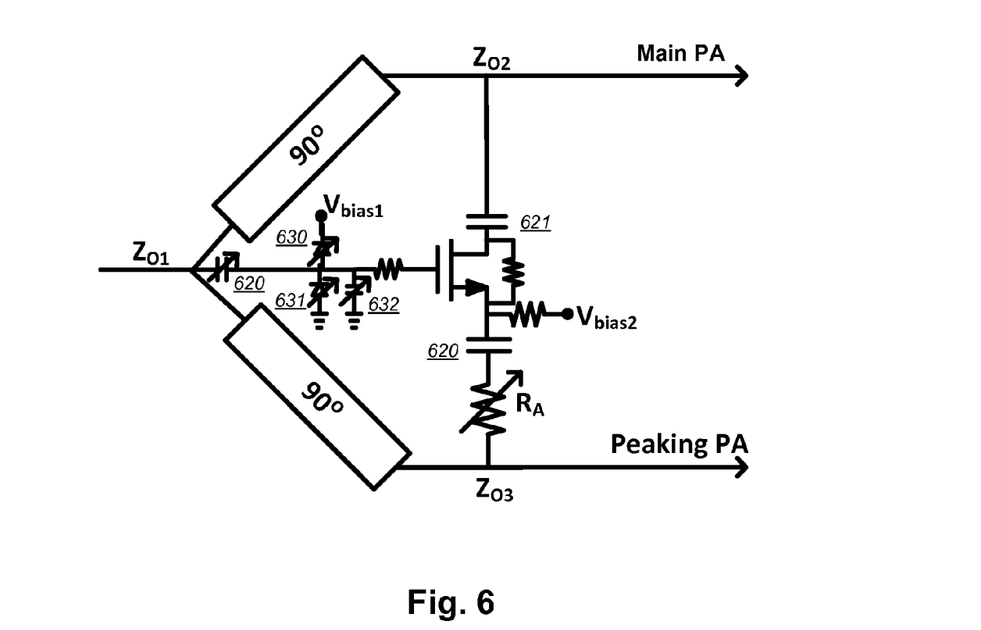
FIG. 6 illustrates an example power divider at the input of a power amplifier according to another embodiment.

FIG. 6 illustrates an example power divider at the input of a power amplifier according to another embodiment. In this example, capacitors 621-622 provide DC isolation around the envelope tracking components and variable impedance set by the transistor. This example also illustrates another aspect. In this example, capacitor 620, diodes 630-631, and capacitor 632 are variable (e.g., programmable). Accordingly, embodiments of the disclosure may be fine-tuned either during manufacturing or dynamically during operation to optimize performance for a particular application or set of operating conditions.

Figure 7:
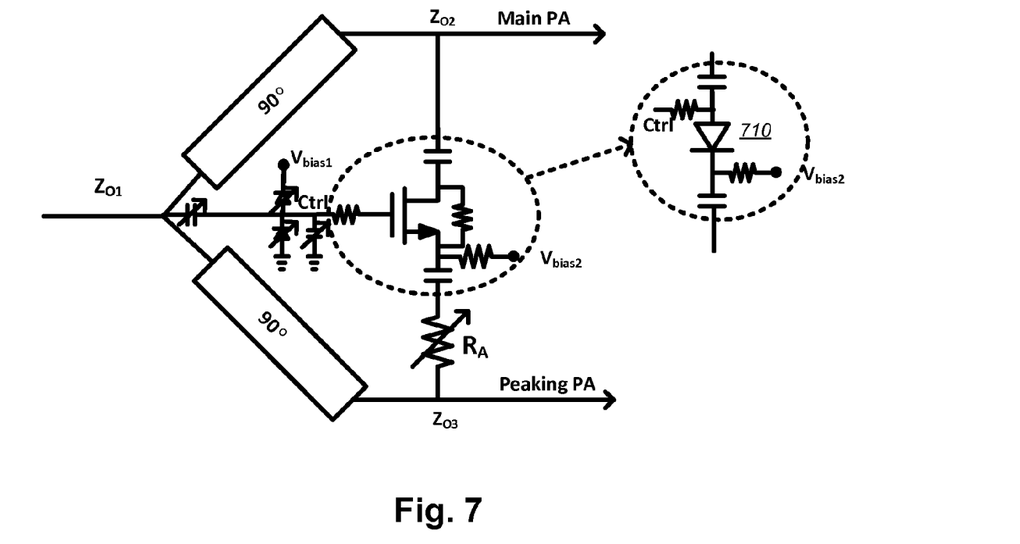
FIG. 7 illustrates an example power divider at the input of a power amplifier according to another embodiment.

FIG. 7 illustrates an example power divider at the input of a power amplifier according to another embodiment. In this example, the semiconductor device is a PIN diode 710. A PIN diode is a diode with an intrinsic semiconductor region between a p-type semiconductor and an n-type semiconductor region. The intrinsic region may be a wide and lightly doped "nearly" intrinsic material. In this example, RF resistance between output terminals of the power divider at Zo2 and Zo3 may be changed quickly by changing the bias current through a PIN diode. At high frequencies, the PIN diode appears as a resistor whose resistance is an inverse function of its forward current. Consequently, PIN diode 710 provides variable attenuation. As the control signal, Ctrl (e.g., from a power control circuit) is changed, the current through PIN diode 710 changes, and the resistance changes.

Figure 8:
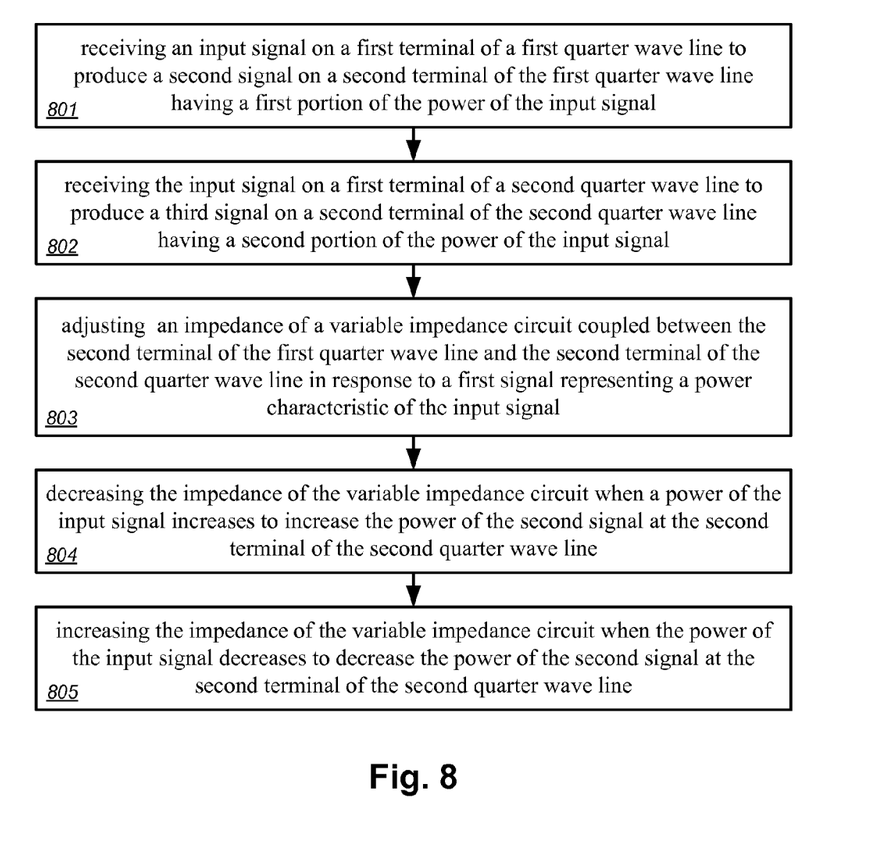
FIG. 8 illustrates a method of dividing input signal power according to one embodiment.

FIG. 8 illustrates a method of dividing input signal power according to one embodiment. At 801, an input signal is received on a first terminal of a first quarter wave line to produce a second signal on a second terminal of the first quarter wave line having a first portion of the power of the input signal. At 802, the input signal is received on a first terminal of a second quarter wave line to produce a third signal on a second terminal of the second quarter wave line having a second portion of the power of the input signal. At 803, an impedance of a variable impedance circuit coupled between the second terminal of the first quarter wave line and the second terminal of the second quarter wave line is adjusted in response to a first signal representing a power characteristic of the input signal. At 804, the impedance of the variable impedance circuit is decreased when a power of the input signal increases to increase the power of the second signal at the second terminal of the second quarter wave line.

At 805, the impedance of the variable impedance circuit is increased when the power of the input signal decreases to decrease the power of the second signal at the second terminal of the second quarter wave line.

Figure 9:
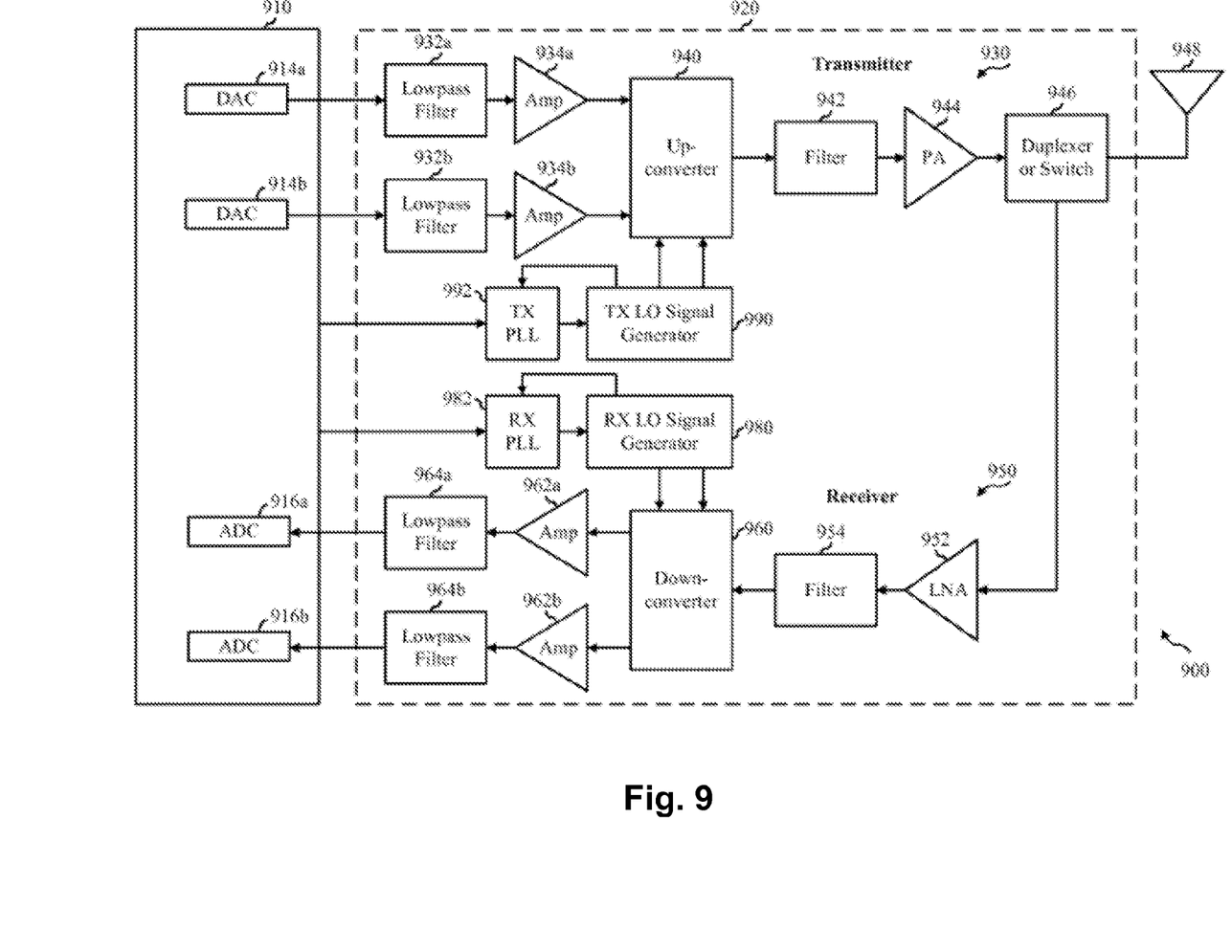
FIG. 9 illustrates a wireless system including dynamic power division according to one embodiment.

FIG. 9 illustrates a wireless system including a power divider according to an embodiment. Wireless system 900 may include baseband circuits 910 for sending, receiving, and processing baseband digital signals to and from a transceiver 920. Transceiver 920 sends and receives RF communication signals to and from and antenna 948. Digital communication signals are converted to analog signals in DACs 914a-b and coupled to a transmit channel 930, where "a" and "b" channels may correspond to "I" and "Q" components of the signal. The analog signals are low pass filtered (blocks 932a-b), amplified (blocks 934a-b), and upconverted (block 940) using a local oscillator (LO) signal from a transmit (TX) phase locked loop (PLL) 992 and a TX LO signal generator 990. The upconverted signal is filtered (block 942) and coupled to a power amplifier 944. Power amplifier (PA) 944 may include circuits for generating an envelope tracking signal from the input signal envelope and may include circuitry described herein for dividing power of the input signal and coupling multiple output signals to different stages of the power amplifier, for example. PA 944 may further include a Doherty power amplifier as described above, for example. The output of PA 944 is coupled through a duplexer or switch 946 to an antenna for broadcasting the RF signals.

Transceiver 920 further includes a receive channel (or receiver) 950 including a low noise amplifier (LNA) 952 for receiving signals from antenna 948. The output of LNA 952 is filtered (block 954) and downconverted (block 960) using an LO signal from a receiver (RX) phase locked loop (PLL) 982 and a RX LO signal generator 980, for example. The downconverted signals are amplified (blocks 962a-b), filtered (blocks 964a-b) and coupled to ADCs 916a-b in the baseband circuits 910 for conversion to the digital domain for further signal processing.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a first quarter wave line having a first terminal and a second terminal, wherein the first terminal of the first quarter wave line receives an input signal;
   a second quarter wave line having a first terminal and a second terminal, wherein the first terminal of the second quarter wave line receives the input signal;
   a variable impedance circuit coupled between the second terminal of the first quarter wave line and the second terminal of the second quarter wave line, the variable impedance circuit having a control input to adjust an impedance of the variable impedance circuit; and
   a power control circuit configured to receive a first signal representing a power characteristics of the input signal and an output coupled to the control input of the variable impedance circuit to adjust the impedance of the variable impedance circuit responsive to the first signal,
   wherein the impedance of the variable impedance circuit is decreased when a power of the input signal increases to increase the power at the second terminal of the second quarter wave line, and the impedance of the variable impedance circuit is increased when the power of the input signal decreases to decrease the power at the second terminal of the second quarter wave line.

2. The circuit of claim 1 wherein the second terminal of the first quarter wave line is coupled to a first power amplifier stage and the second terminal of the second quarter wave line is coupled to a second power amplifier stage, and wherein the first power amplifier stage and the second power amplifier stage drive an antenna.

3. The circuit of claim 2 wherein the first power amplifier stage and the second power amplifier stage comprise a Doherty power amplifier.

4. The circuit of claim 1 further comprising an adjustable LC circuit, wherein in a first configuration the adjustable LC circuit produces a first impedance at the second terminal of the second quarter wave line and a corresponding second impedance at the first terminal of the second quarter wave line, wherein the first impedance is less than the second impedance, and wherein in a second configuration the adjustable LC circuit produces a third impedance at the second terminal of the second quarter wave line and a corresponding fourth impedance at the first terminal of the second quarter wave line, wherein the third impedance is greater than the fourth impedance.

5. The circuit of claim 4 wherein the adjustable LC circuit is configured to produce the first impedance when the power of the input signal decreases to decrease the power of the input signal transferred from the first terminal of the second quarter wave line to the second terminal of the second quarter wave line, and wherein the adjustable LC circuit is configured to produce the third impedance when the power of the input signal increases to increase the power of the input signal transferred from the first terminal of the second quarter wave line to the second terminal of the second quarter wave line.

6. The circuit of claim 1 wherein the adjustable impedance circuit comprises a programmable resistor network.

7. The circuit of claim 1 wherein the adjustable impedance circuit comprises at least one semiconductor device.

8. The circuit of claim 7 wherein the semiconductor device comprises PIN diode, and wherein the control input adjusts current through the PIN diode.

9. The circuit of claim 7 wherein the semiconductor device comprises a transistor having a first terminal coupled to the second terminal of the first quarter wave line, a second terminal coupled to the second terminal of the second quarter wave line, and a control terminal comprising said control input.

10. The circuit of claim 7 wherein the adjustable impedance circuit further comprises a programmable resistor network.

11. The circuit of claim 10 wherein the power control circuit comprises:
   an envelope detector, wherein the output of the power control circuit comprises a first output coupled to the at least one semiconductor device for changing the impedance at a rate of an envelope of the input signal: and
   an average power generator, wherein the output of the power control circuit further comprises a second output coupled to the programmable resistor network to change a programmed resistance according to an average power of the input signal.

12. The circuit of claim 1 wherein the power control circuit comprises an envelope detector.

13. The circuit of claim 1 wherein the first quarter wave line comprises at least one inductor and the second quarter wave line comprises at least one inductor.

14. The circuit of claim 1 wherein the power control circuit produces said control signal corresponding to an envelope of the input signal.

15. The circuit of claim 1 wherein the power control circuit produces said control signal corresponding to an average power of the input signal.

16. The circuit of claim 1 wherein the first signal received by the power control circuit is a power control signal from a modem.

17. A method comprising:
receiving an input signal on a first terminal of a first quarter wave line to produce a second signal on a second terminal of the first quarter wave line having a first portion of the power of the input signal;
receiving the input signal on a first terminal of a second quarter wave line to produce a third signal on a second terminal of the second quarter wave line having a second portion of the power of the input signal; and
adjusting an impedance of a variable impedance circuit coupled between the second terminal of the first quarter wave line and the second terminal of the second quarter wave line in response to a first signal representing a power characteristic of the input signal,
wherein the impedance of the variable impedance circuit is decreased when a power of the input signal increases to increase the power of the second signal at the second terminal of the second quarter wave line, and the impedance of the variable impedance circuit is increased when the power of the input signal decreases to decrease the power of the second signal at the second terminal of the second quarter wave line.

18. The method of claim 17 further comprising adjusting an impedance at the second terminal of the second quarter wave line using an adjustable LC circuit, wherein in a first configuration the adjustable LC circuit produces a first impedance at the second terminal of the second quarter wave line and a corresponding second impedance at the first terminal of the second quarter wave line, wherein the first impedance is less than the second impedance, and wherein in a second configuration the adjustable LC circuit produces a third impedance at the second terminal of the second quarter wave line and a corresponding fourth impedance at the first terminal of the second quarter wave line, wherein the third impedance is greater than the fourth impedance.

19. A circuit comprising:
means for receiving an input signal on a first terminal of a first quarter wave line to produce a second signal on a second terminal of the first quarter wave line having a first portion of the power of the input signal;
means for receiving the input signal on a first terminal of a second quarter wave line to produce a third signal on a second terminal of the second quarter wave line having a second portion of the power of the input signal; and
means for adjusting an impedance of a variable impedance circuit coupled between the second terminal of the first quarter wave line and the second terminal of the second quarter wave line in response to a first signal representing a power characteristic of the input signal,
wherein the impedance of the variable impedance circuit is decreased when a power of the input signal increases to increase the power of the second signal at the second terminal of the second quarter wave line, and the impedance of the variable impedance circuit is increased when the power of the input signal decreases to decrease the power of the second signal at the second terminal of the second quarter wave line.

20. The method of claim 19 further comprising means for adjusting an impedance at the second terminal of the second quarter wave line using an adjustable LC circuit, wherein in a first configuration the adjustable LC circuit produces a first impedance at the second terminal of the second quarter wave line and a corresponding second impedance at the first terminal of the second quarter wave line, wherein the first impedance is less than the second impedance, and wherein in a second configuration the adjustable LC circuit produces a third impedance at the second terminal of the second quarter wave line and a corresponding fourth impedance at the first terminal of the second quarter wave line, wherein the third impedance is greater than the fourth impedance.

\* \* \* \* \*